United States Patent
Schmidt

[11] Patent Number: 5,943,216
[45] Date of Patent: Aug. 24, 1999

[54] APPARATUS FOR PROVIDING A TWO-SIDED, CAVITY, INVERTED-MOUNTED COMPONENT CIRCUIT BOARD

[75] Inventor: Dominik J. Schmidt, San Jose, Calif.

[73] Assignee: Photo Opto Electronic Technologies, Westlake, Calif.

[21] Appl. No.: 08/868,365

[22] Filed: Jun. 3, 1997

[51] Int. Cl.⁶ .............................. H05K 1/18; H05K 7/02
[52] U.S. Cl. ............................................ 361/761; 361/764
[58] Field of Search ..................................... 174/260, 261; 257/723, 690, 724; 361/761–764; 439/68, 69; 438/124, 126, 127

[56] References Cited

U.S. PATENT DOCUMENTS

| | | | |
|---|---|---|---|
| 4,719,384 | 1/1988 | Hauden et al. | 361/764 |
| 4,994,938 | 2/1991 | Baudouin | 361/761 |
| 5,495,394 | 2/1996 | Kornfeld et al. | 361/764 |
| 5,550,086 | 8/1996 | Tai | 438/126 |
| 5,689,091 | 11/1997 | Hamzehdoost et al. | 361/764 |
| 5,710,695 | 1/1998 | Manteghi | 361/764 |
| 5,748,452 | 5/1998 | Londa | 361/764 |
| 5,801,438 | 9/1998 | Shirakawa et al. | 257/723 |
| 5,831,833 | 11/1998 | Shirakawa et al. | 361/764 |

FOREIGN PATENT DOCUMENTS

| | | | |
|---|---|---|---|
| 2-134890 | 5/1990 | Japan | 439/68 |
| 3-29389 | 2/1991 | Japan | 361/764 |
| 5-13647 | 1/1993 | Japan | 257/690 |
| 5-190739 | 7/1993 | Japan | 257/690 |

*Primary Examiner*—Donald Sparks
*Attorney, Agent, or Firm*—Blakely, Sokoloff, Taylor & Zafman LLP

[57] ABSTRACT

An apparatus and method of providing a printed wiring board is disclosed. The printed circuit board comprises a printed wiring board that has at least one opening. The printed circuit board further comprises a circuit component that is located within the opening and is electrically connected to the printed wiring board. Various embodiments are disclosed.

18 Claims, 7 Drawing Sheets

APPARATUS FOR PROVIDING A TWO-SIDED, CAVITY, INVERTED-MOUNTED COMPONENT CIRCUIT BOARD

BACKGROUND OF THE INVENTION

1. Field of the Invention

The present invention relates in general to printed circuit boards and a method of manufacturing a printed circuit board. In particular, the present invention relates to a thin, flat, two-sided printed circuit board having openings in which components are mounted.

2. Description of the Related Art

High density printed circuit boards create greater utility in a smaller electronic device. Increasing the density of circuit components on a printed circuit board, however, often results in overheating of the components, leading to eventual burnout and replacement of the components. The resulting overheating can also cause higher stress and strain in the interconnects, such as solder joints, leading to an early failure. Moreover, the trend towards an increasingly compact product has resulted in increasing use of thinner and smaller printed circuit boards. Consequently, chips have decreased in thickness and are attached closer and closer to the printed circuit board.

Conventional methods of mounting circuit components on a printed circuit board include a "thorough-hole" technique which involves extending leads of a circuit component through the printed circuit board and then soldering the leads in place. The leads electrically connect circuit paths embedded on or within the board.

Another mounting method, known as "Surface Mount Technology" (SMT), involves initially placing circuit components onto circuit paths embedded on the upper surface of the printed circuit board and then soldering the component in place using a process called "reflow soldering." Surface mount components utilize connector leads commonly referred to as "J-leads" which rest on the surface of the printed circuit board rather than penetrate through it as with the through-hole technique.

The application of SMT increases the density of circuit components on a printed circuit board by enabling the use of smaller components which are arranged in a flat configuration on the surface of the board. In such surface mounted components, the leads to be mounted may be tightly spaced, as compared to components mounted by the thorough-hole technique, enabling increased access per unit area of the component. However, the resulting circuit board is still bulky, as the components extend from either surface of the board. In addition, in printed circuit boards manufactured using SMT, components occupy approximately 60% of the board, severely limiting routing connections. In contrast, in circuit boards designed for receiving dual-in-time packaging (DIP) components, typically only 19% of the board surface is covered by components, leaving ample room for routing connections.

Other current techniques of mounting circuit components include embedding chips into recesses in the board to further reduce the overall thickness of the board. However, such a technique suffers from several drawbacks. First, the chips are not firmly held in place. Second, the use of recesses for embedding the chips prevent two-sided wiring. Thirdly, only selected components are placed in these recesses, while the remaining components are surface mounted. This results in providing a printed circuit board that is still bulky.

Accordingly, there is a need in the technology for a method and apparatus of providing a printed wiring board that is cost-effective, thin, flat and strong. The printed wiring board must also provide two-sided wiring, high integrated component density and must also hold the components securely in place.

BRIEF SUMMARY OF THE INVENTION

An apparatus and method of providing a printed wiring board is disclosed. The printed circuit board comprises a printed wiring board that has at least one opening. The printed circuit board further comprises a circuit component that is located within the opening and is electrically connected to the printed wiring board. A method of manufacturing and assembly a plurality of printed wiring boards is also disclosed. Various embodiments are included.

DETAILED DESCRIPTION OF THE INVENTION

Figure 1:
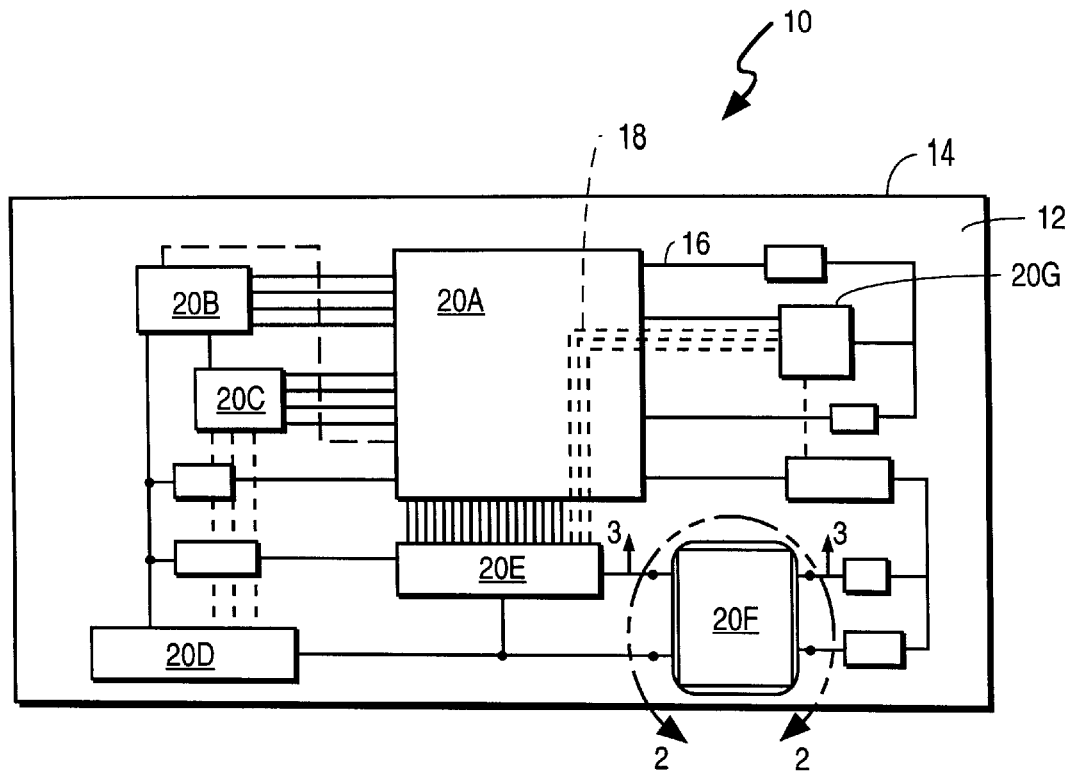
FIG. 1 is a top view of one embodiment of the printed wiring board of the present invention.

FIG. 1 is a top view of one embodiment of the printed wiring board of the present invention. The printed wiring board 10 has a first side 12 and a second side 14. Each side 12 and 14 includes a substrate having printed interconnections 16 and 18, respectively. The printed wiring board 10 also defines openings 20a–20g each having a sufficient size to receive an electrical component such as a semiconductor chip or a resistor. For discussion purposes, the openings 20a–20g will be collectively referred to as an opening 20.

Figure 2:
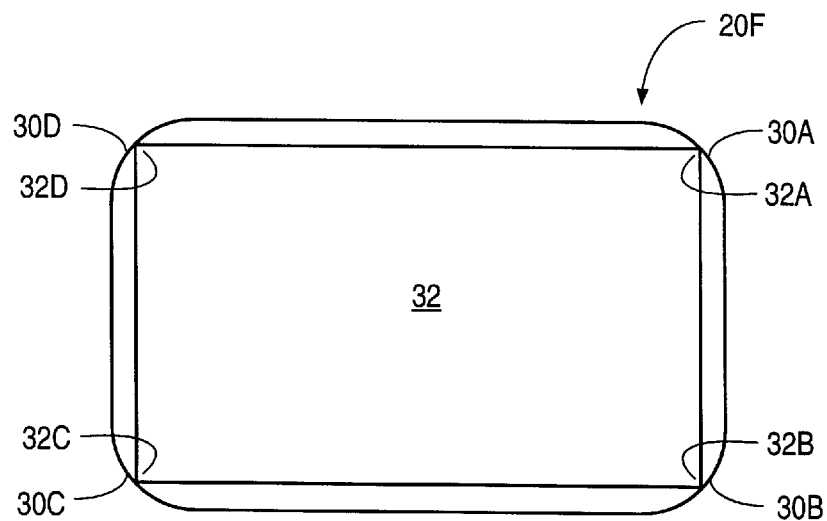
FIG. 2 is an enlarged view of an opening of the printed wiring board of the present invention, taken along lines 2—2.

FIG. 2 is an enlarged view of the opening 20f of the printed wiring board of the present invention, taken along lines 2—2. As shown in the Figure, each opening 20, such as the opening 20f, has rounded edges 30a–30d which are tooled to provide a secure fitting for the electrical component 32. In particular, each of the corners 32a–32d of the electrical component 32 fit securely into the edges 30a–30d.

Figure 3:
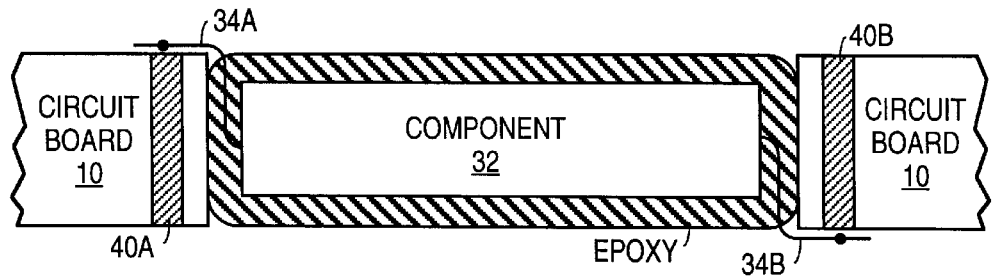
FIG. 3 is a side view of the printed wiring board of FIG. 1, taken along lines 3—3.

FIG. 3 is a side view of the printed wiring board 10 of FIG. 1, taken along lines 3—3. As shown in FIG. 3, the printed wiring board 10 also has a plurality of via connections or through holes 40a and 40b (collectively referred to as through-holes 40). Once the component 32 has been securely fitted in the opening 20, its leads 34a and 34b are soldered to the appropriate printed interconnections 16 and/or 18 (FIG. 1) at the appropriate through holes. To ensure a secure connection, and to facilitate interconnections on either side of the printed wiring board 10, solder is permitted to flow into each through hole 40. The component 32 is then epoxy coated. In one embodiment, the opening 20 which receives the component 32 is also filled with epoxy. Examples of the epoxy used include that manufactured by ITW DEVCON under the tradename FR4 or "5-minute epoxy resin" and that manufactured by Al Technology under the part designation E67655-5-SM21.

Figure 4:
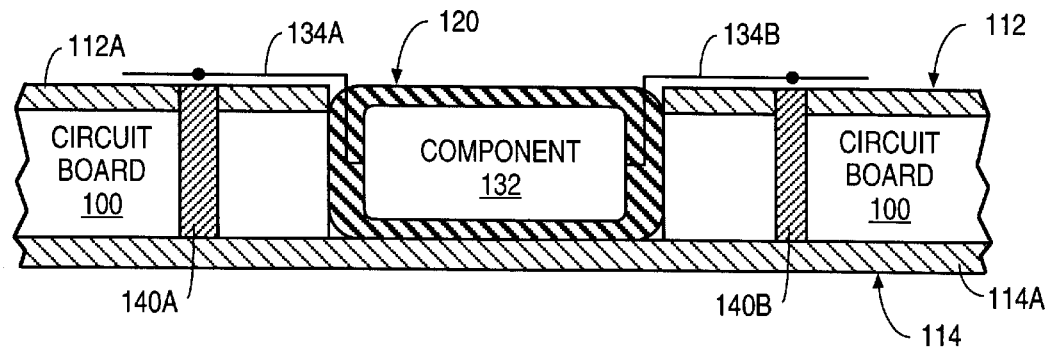
FIG. 4 is a side view of a second embodiment of the printed wiring board of the present invention.

FIG. 4 is a side view of a second embodiment of the printed wiring board 100 of the present invention. As shown in FIG. 4, the printed wiring board 100 has a first side 112 and a second side 114. Each side 112 and 114 is laminated with a metal 112a and 114a respectively, such as copper foil. The printed wiring board 100 also defines a plurality of openings (only one opening 120 is shown), each having a sufficient size to receive an electrical component 132 such as a semiconductor chip or a resistor. The opening 120 is out such that the metal laminate on the second side 114 is left intact. The printed wiring board 100 also has a plurality of via connections or through holes 140a and 140b (collectively referred to as through holes 140). Once the component 132 has been securely fitted into the opening 120, its leads 134a and 134b are soldered to the appropriate printed interconnections 16 and/or 18 (FIG. 1) at the appropriate through holes. To ensure a secure connection, and to facilitate interconnections on either side of the printed wiring board 100, solder is permitted to flow into each through hole 140. The component 132 is then epoxy coated.

Figure 5A:
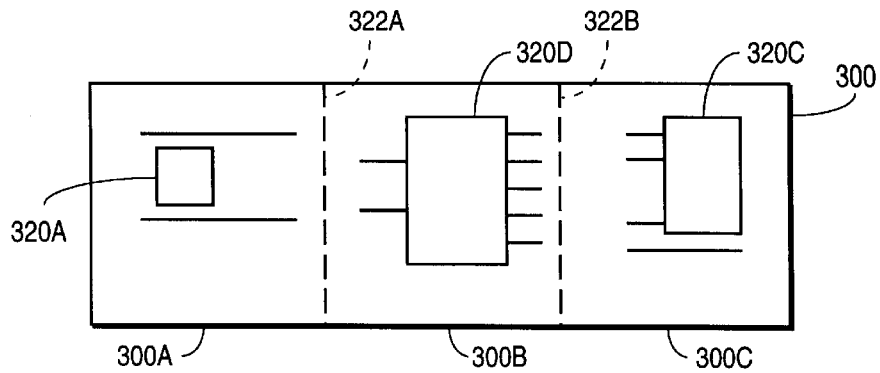
FIGS. 5A–5D illustrate one embodiment of the manufacturing and assembly process of the present invention.
Figure 5B:
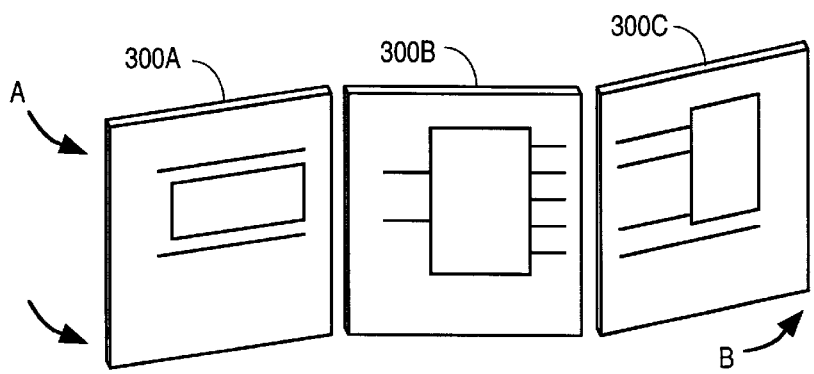
Figure 5C:
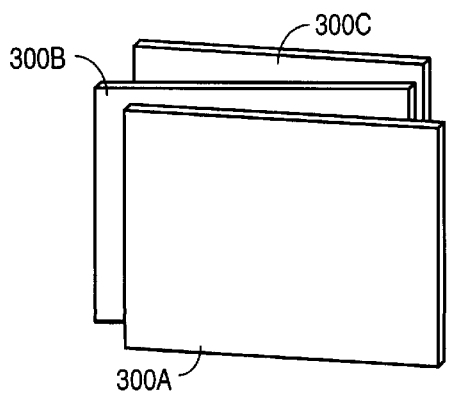
Figure 5D:
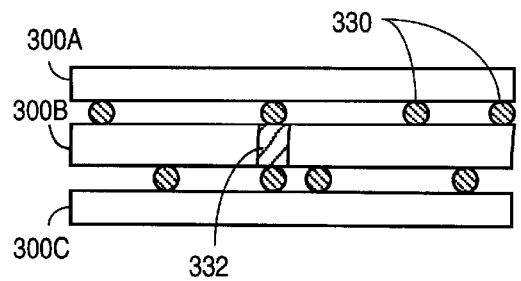

Another aspect of the present invention involves the manufacture and assembly of printed wiring boards, as shown in FIGS. 5A–5D. In particular, FIG. 5A illustrates a printed wiring board 300, which is divided into a plurality of smaller board sections 300a, 300b and 300c, for example, along lines 322a and 322b. Alternatively, the smaller board sections 300a, 300b and 300c may be predesigned and/or manufactured so as to fit together. In this case, cutting of the board 300 into smaller pieces is not required. The printed wiring board 300 may be manufactured in the same manner as printed wiring board 10 or 100 as discussed above. For example, openings 320a, 320b and 320c (collectively referred to as "openings 320") may be cut in each of the board sections 300a, 300b and 300c respectively. In addition, components (not shown) may be fitted into the openings 320 as discussed above. Next, the printed wiring board 300 is cut along lines 322a and 322b, as shown in FIG. 5B. Solder bump interconnections 330 are provided to facilitate electrical connections between adjacent board sections 300a, 300b and 300b, 300c (FIG. 5D), before the printed wiring board sections 300a, 300b and 300c are stacked together, as shown in FIG. 5C. It is apparent to one of ordinary skill in the art that a plurality of printed wiring boards 10 and/or 100 may be interconnected using the solder bump interconnection technique as shown in FIG. 5D. In a preferred embodiment, the board sections are coated with a non-conductive material so that each board section 300a, 300b or 300c is insulated from the other board sections except at the interconnections 330. In one embodiment, the interconnections 330 are coated with a substance that negates the non-conductive coating. An example of such a coating is that manufactured by Dupont under the tradename Teflon. In addition, solder-filled vias such as via 332 may be used to facilitate interconnection between non-adjacent boards. It should be noted that, although some components, such as large capacitors, will not fit within an opening in a single board, additional boards that are stacked above the first board may be conformed and/or cut to fit around the large components. For example, corresponding openings may be cut in the additional boards so that a large component that is mounted in an opening of a first board may also be accommodated in corresponding openings in the other stacked boards. As a result, a very high density solution may be provided.

Such a manufacturing and assembly process is advantageous because 2-dimensional layout tools may be used to make 3-dimensional boards. In addition, vertical interconnects may be easily provided. Most importantly, such a manufacturing and assembly process (which facilitates stacking of the resulting board section) is possible because of the flatness of the resulting component mounted boards.

Figure 6:
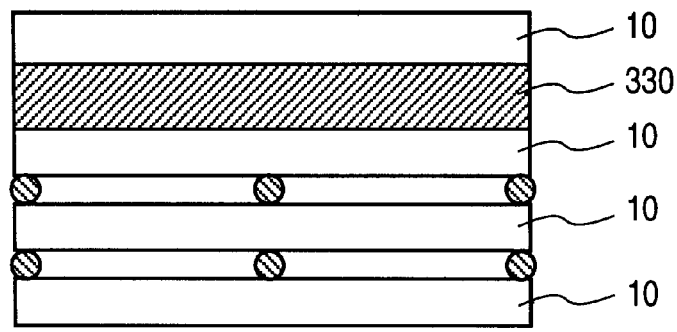
FIG. 6 is a cross-sectional view of one embodiment of the stacked printed wiring boards of the present invention, which implements a thermoelectric cooling layer.
Figure 7:
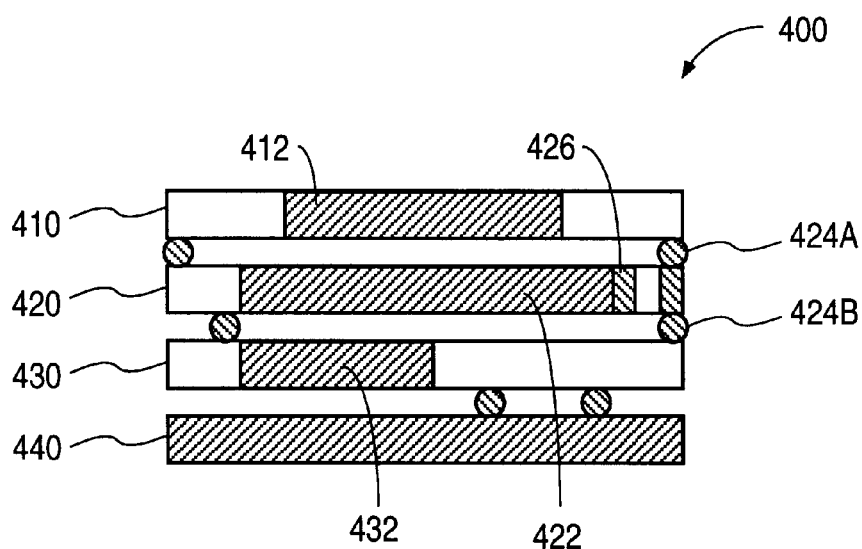
FIG. 7 is a cross-sectional view of a second embodiment of the stacked printed wiring boards of the present invention, which incorporates a flat battery.

A further aspect of the present invention involves the use of a thermocooling layer to provide cooling for a plurality of stacked printed wiring boards 10, 100 and/or 300a, 300b, 300c. As shown in FIG. 6, a plurality of printed wiring boards 10, may include a thermocooling layer 350. Examples of the thermocooling layer 350 include that manufactured by RMT Limited of Moscow, Russia, under the part designation 1MS 03-030-L and that manufactured by Alpha and Omega Computer Incorporated of Anaheim, Calif., under the tradename "Peltier Junction Active Cooler". The use of such a thermocooling layer 350 will facilitate the dissipation of heat from high power processors. In one embodiment, the thermocooling layer 350 may be embedded into any one of the printed wiring boards 10. An example of such an arrangement is shown FIG. 7, where a thermocooling layer 422 is embedded in a printed wiring board 420.

Yet another aspect of the present invention involves the use of flat batteries to provide the voltage and current requirements of a system which implements the use of printed wiring boards. Such a system 400 comprises a plurality of layers 410, 420, 430 and 440. In one embodiment, layers 410 and 430 are printed wiring boards such as the printed wiring board 10, 100, 300a, 300b or 300c. Each board 410 and 430 has an opening in which a component 412 and 432 respectively, such as a chip, may be fitted and epoxied, as described above. The printed wiring board 410 may be electrically connected with the non-adjacent printed wiring board 430 by means of the solder bumps 424a, 424b and a via 426. In one embodiment, layer 420 is printed wiring board 10, 100, 300a, 300b or 300c, in which a thermocooling layer 422 is embedded. The thermocooling layer 422 is identical to that shown in FIG. 6 and described above. In another embodiment, the thermocooling layer 422 is located adjacent to a heat sink 424, which facilitates the transfer of heat from one end of the layer 420 to the other end. In a further embodiment, layer 440 is a flat battery. Examples of such a flat battery includes the flat lithium-ion battery manufactured by Ultralife, Inc. under the tradename "Solid State System".

Figure 8:
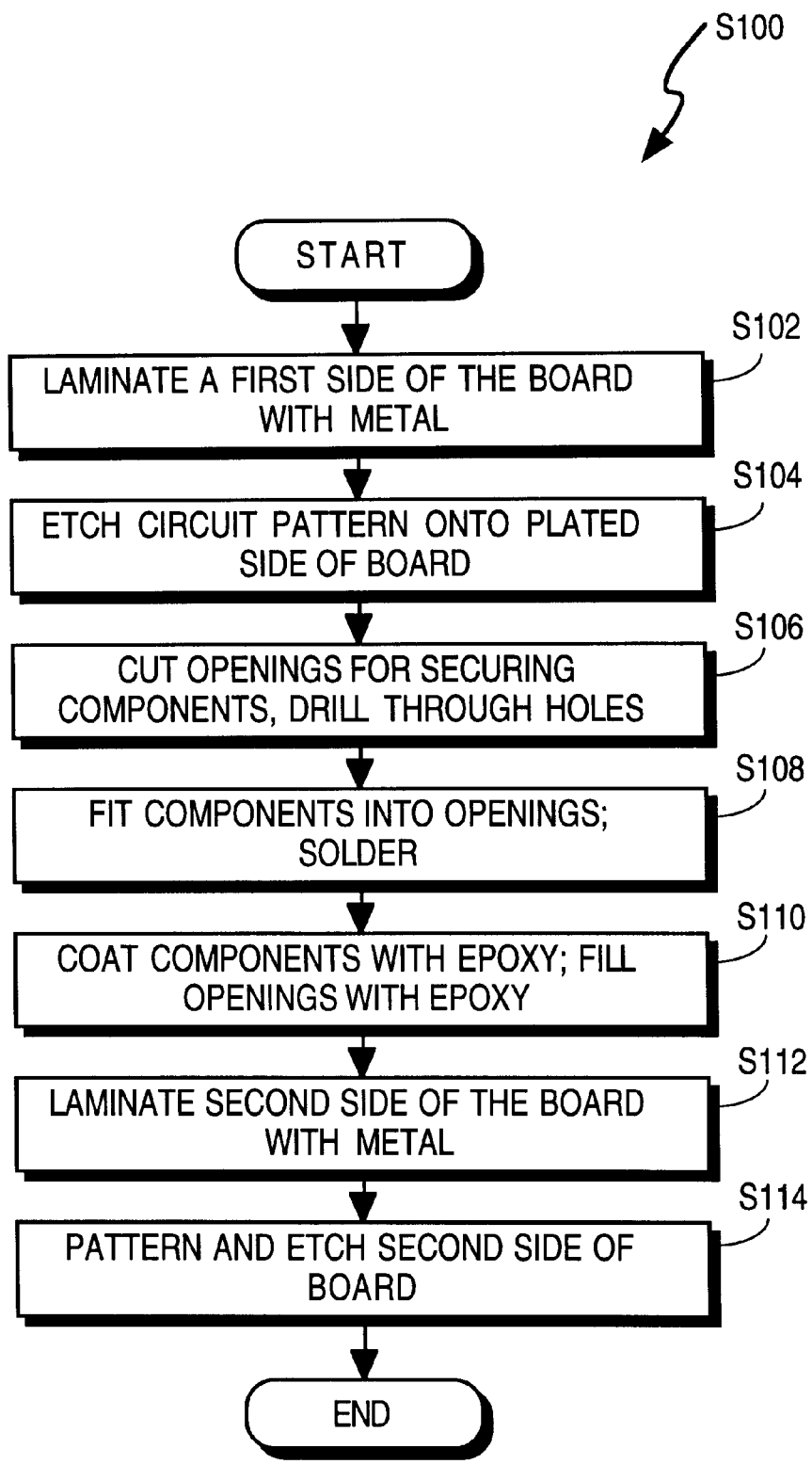
FIG. 8 is a flowchart of one embodiment of the manufacturing process S100 of the printed wiring board of the present invention.

One embodiment of the process S100 for manufacturing the printed wiring board 10 of the present invention, as illustrated in FIG. 8, will now be described. The board 10 is first laminated on a first side (step S102) with a metal. In one embodiment, the metal is copper foil. A circuit pattern is then etched onto the first side of the board 10 (step S104). The openings 20a–20g are then cut from the board 10 (step S106). The openings 20a–20g are cut so that each opening has rounded edges 30a–d which are tooled to provide a secure fitting for a corresponding electrical component. At the same time, holes 40 for via connections are also drilled. Next, the components 32 are fitted into their corresponding openings 20 and then soldered (step S108). In particular, solder is permitted to flow into the through holes 40 to ensure a secure connection. Once the components 32 are situated, they are coated with epoxy (step 110). The openings in which the components 32 are located are also fitted with epoxy. The second side of the board 10 is then laminated with a metal. In one embodiment, the metal copper is foil. A circuit pattern is then etched onto the metal on the second side of the board 10 (step S114).

Figure 9:
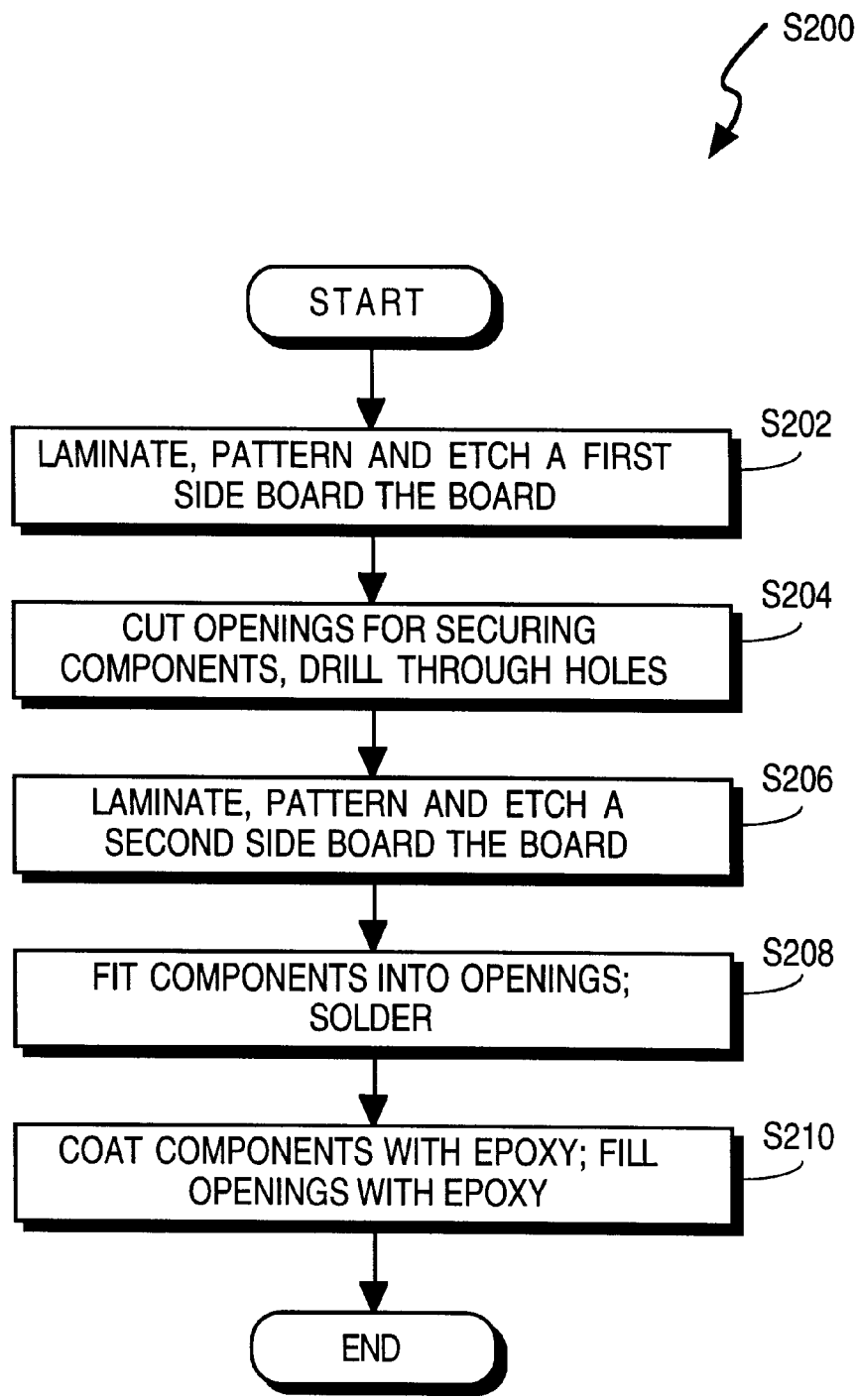
FIG. 9 is a flowchart of a second embodiment of the manufacturing process S200 of the printed wiring board 10 of the present invention.

FIG. 9 illustrates an alternate embodiment of the process S200 for manufacturing the printed wiring board 10 of the present invention. The board 10 is first laminated with a metal, patterned and etched on a first side (step S202). In one embodiment, the metal is copper foil. Next, the openings 20 are cut and the through holes are drilled (step S204). A second side of the board 10 is then laminated with a metal, patterned and etched (step S206) before the components 32 are fitted into the openings. In one embodiment, the metal is copper foil. Next, the components 32 are fitted into their corresponding openings 20 and then soldered into place (step S208). The components 32 are then epoxy-coated and the openings 20 are filled with epoxy (step S210).

Figure 10:
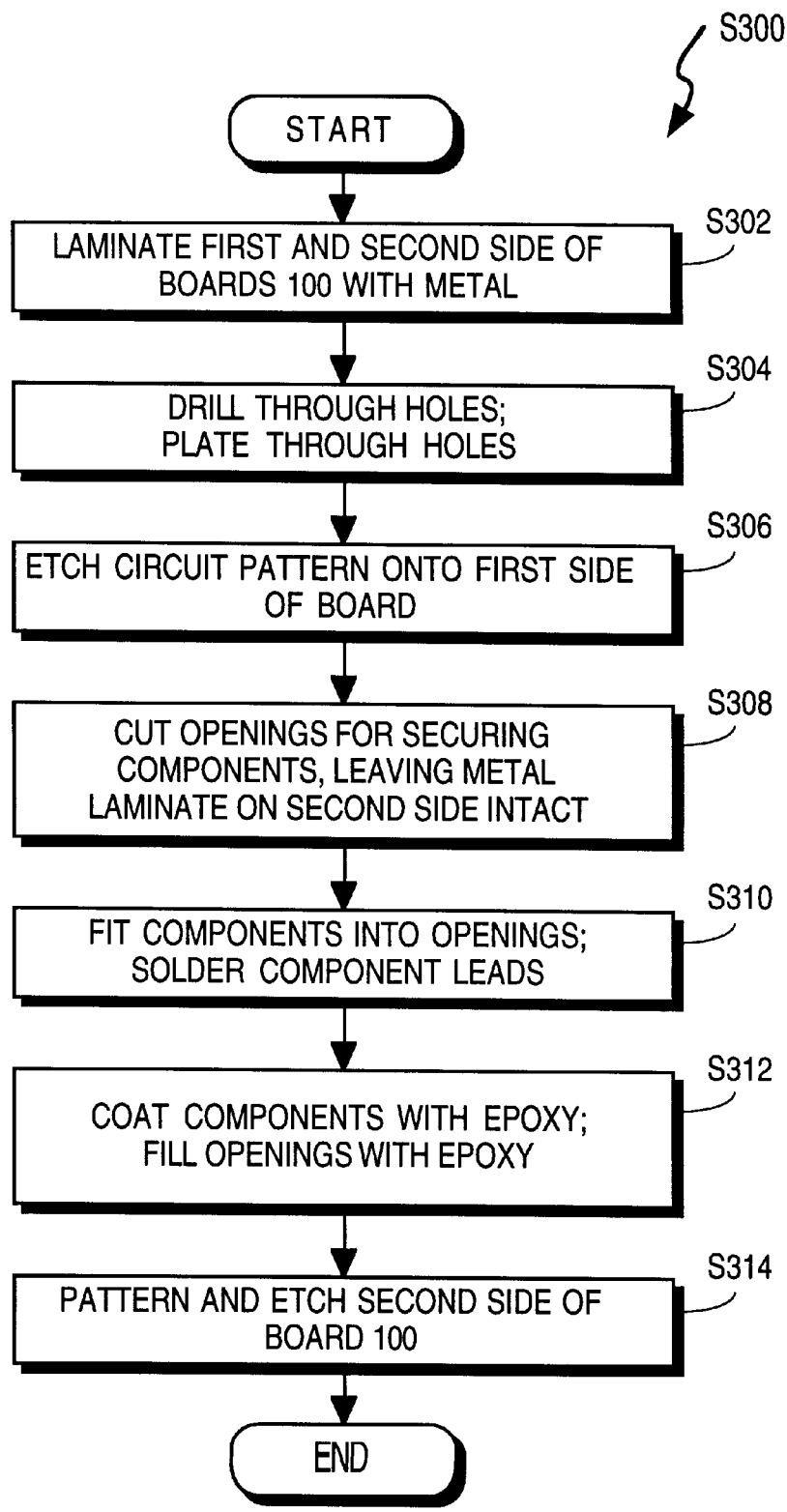
FIG. 10 is a flowchart of a third embodiment of the manufacturing process S300 of the printed wiring board 100 of the present invention.

FIG. 10 illustrates a third embodiment of the manufacturing process S300 of the printed wiring board 100 of the present invention. The board 100 (FIG. 4) is first laminated with metal 112a and 114b on sides 112 and 114 of the board 100 (step S302). In one embodiment, the metal is copper foil. Next, holes 140 for via connections are drilled and plated with metal, such as copper foil (step S304). The circuit pattern for the first side 112 of the board 100 is then etched (step S306). Next, the openings 120 are cut from the board 100, such that the metal laminate 114b on the second side 114 of the board 100 is left intact (step S308). The components 132 are then fitted into the corresponding opening 120 and the component leader 134a, 134b of each component 132 are soldered into place (step S310). The components 132 are then coated with epoxy and the openings 120 (with the components 132 in place) epoxy and the opening 120 (with the components 132 in place) are also coated with epoxy (step S312). The second side 114 of the board 100 are then patterned and etched (step S314). The process S300 then laminates.

It is apparent to one of ordinary skill in the art that in each of the processes described above, additional layers of routing can be added on one or both sides of the finished board where each layer is provided by plating the board with metal (such as copper), etching the metal and then depositing of an insulating layer on the metal. Vias may be used to provide interconnection between the layers.

The process of the present invention lends itself well to automation because component placement is accurately determined by the holes, which are easy to provide, with good alignment. The resulting board thickness is uniform and is determined by the largest electronic component used, which is typically 1 mm. As a result, the board is flush, and no components will be sticking out from the board. The board is further strengthened through the use of epoxy and can support a very high integrated density, with a component to wiring area ratio of 2:1. The board can also be maintained at a reasonable cost. This is because the board is totally flat, with no exposed leads or pins, so that dirt, grime and metal particles will not be trapped on the board. As a result, shorts (and thus unreliable operation) are eliminated or greatly reduced.

In the process of the present invention also facilitates connections to non-adjacent boards, and for providing circuit boards that may be integrated into a compact package, while providing sufficient cooling, through the use of special thermoelectric cooling.

The present invention may be embodied in other specific forms without departing from its spirit or essential characteristics. The described embodiments are to be considered in all respects only as illustrative and not restrictive. For example, the electrical component may be an integrated chip or a discrete component such as a resistor, a capacitor or a transistor. The scope of the invention is, therefore, indicated by the appended claims rather than the foregoing description. All changes which come within the meaning and range of equivalency of the claims are to be embraced within their scope.

What is claimed is:

1. A printed circuit board, comprising:
    a printed wiring board having at least one opening, wherein the printed wiring board has first and second surfaces, wherein each of the first and second surfaces has at least one printed circuit connection; and
    a packaged circuit component electrically connected to the printed wiring board, said packaged circuit component located within said opening, wherein the at least one opening is filled with epoxy to surround the packaged circuit component and to create a flat surface with a side of the printed wiring board and the epoxy-filled opening, wherein said packaged circuit component has first and second leads coupled to the printed circuit connections on the first and second surfaces, respectively.

2. The printed circuit board of claim 1, wherein said printed wiring board has at least one via that is filled with an electrically conductive material.

3. The printed circuit board of claim 2, wherein said at least one printed circuit connection of said first surface is coupled to said at least one printed circuit connection of said second surface through said via.

4. The printed circuit board of claim 1, wherein the printed wiring board has a first and a second surface, said first surface having a first layer with an opening corresponding to the opening in the printed wiring board, said second surface having a second layer that covers the opening.

5. The printed circuit board of claim 4, wherein the first and the second layers are made of electrically conductive material.

6. The printed circuit board of claim 1, wherein said opening has rounded corners.

7. The printed circuit board of claim 1, further comprising a second printed wiring board having at least one opening; and
    a second packaged circuit component electrically connected to the second printed wiring board, said second packaged circuit component located within said at least one opening of said second printed wiring board, wherein said second packaged circuit component and opening of said second printed wiring board are filled with epoxy.

8. The printed circuit board of claim 7, further comprising a thermocooling layer that is located between said printed wiring board and said second printed wiring board.

9. The printed circuit board of claim 8, wherein said thermocooling layer is embedded within a third printed wiring board.

10. The printed circuit board of claim 1, further comprising a flat battery the is electrically coupled to said printed wiring board.

11. The printed circuit board of claim 1, wherein the packaged circuit component comprises a surface mount package enclosing a silicon die.

12. A printed circuit board, comprising:
a printed wiring board having at least one opening with rounded corners, wherein the printed wiring board has first and second surfaces, wherein each of the first and second surfaces has at least one printed circuit connection; and
a packaged circuit component electrically connected to the printed wiring board, the packaged circuit component located within the at least one opening and secured in place by the rounded corners, wherein the at least one opening is filled with epoxy to surround the packaged circuit component and to create a flat surface with a side of the printed wiring board and the expoxy-filled opening, wherein the packaged circuit component has first and second leads coupled to the printed circuit connections on the first and second surfaces, respectively.

13. The printed circuit board of claim 12, wherein said printed wiring board has at least one via that is filled with an electrically conductive material.

14. The printed circuit board of claim 13, wherein said at least one printed circuit connection of said first surface is coupled to said at least one printed circuit connection of said second surface through said via.

15. The printed circuit board of claim 12, wherein the printed wiring board has a first and a second surface, said first surface having a first layer with an opening corresponding to the opening in the printed wiring board, said second surface having a second layer that covers the opening.

16. The printed circuit board of claim 15, wherein the first and the second layers are made of electrically conductive material.

17. The printed circuit board of claim 12, further comprising a second printed wiring board having at least one opening; and
a second packaged circuit component electrically connected to the second printed wiring board, the second packaged circuit component located within the at least one opening of the second printed wiring board, wherein the second packaged circuit component and opening of the second printed wiring board are filled with epoxy.

18. The printed circuit board of claim 12, wherein the packaged circuit component comprises a surface mount package enclosing a silicon die.

* * * * *